(12) United States Patent
Wu et al.

(10) Patent No.: US 9,090,474 B2
(45) Date of Patent: Jul. 28, 2015

(54) REACTOR AND METHOD FOR GROWING CARBON NANOTUBE USING THE SAME

(71) Applicants: Tsinghua University, Beijing (TW); HON HAI PRECISION INDUSTRY CO., LTD., New Taipei (TW)

(72) Inventors: Yang Wu, Beijing (CN); Peng Liu, Beijing (CN); Yang Wei, Beijing (CN); Jia-Ping Wang, Beijing (CN); Kai-Li Jiang, Beijing (CN); Shou-Shan Fan, Beijing (CN)

(73) Assignees: Tsinghua University, Beijing (CN); HON HAI PRECISION INDUSTRY CO., LTD., New Taipei (TW)

( * ) Notice: Subject to any disclaimer, the term of this patent is extended or adjusted under 35 U.S.C. 154(b) by 188 days.

(21) Appl. No.: 13/869,183

(22) Filed: Apr. 24, 2013

(65) Prior Publication Data
US 2014/0186546 A1  Jul. 3, 2014

(30) Foreign Application Priority Data

Dec. 29, 2012 (CN) .......................... 2012 1 0587684

(51) Int. Cl.
C01B 31/02  (2006.01)
C23C 16/26  (2006.01)
C23C 16/458  (2006.01)

(52) U.S. Cl.
CPC ............. *C01B 31/0226* (2013.01); *C23C 16/26* (2013.01); *C23C 16/4588* (2013.01)

(58) Field of Classification Search
CPC .............. C01B 31/0226; C01B 31/022; C01B 31/0233; C23C 16/26; C23C 16/4587; C23C 16/4588
USPC .......................................... 118/715, 724, 730
See application file for complete search history.

(56) References Cited

U.S. PATENT DOCUMENTS

| | | | |
|---|---|---|---|
| 2006/0185595 A1* | 8/2006 | Coll et al. ..................... | 118/724 |
| 2008/0187648 A1* | 8/2008 | Hart et al. ........................ | 427/8 |
| 2012/0205834 A1 | 8/2012 | Lemaire et al. | |
| 2013/0284344 A1* | 10/2013 | Feng et al. ...................... | 156/84 |
| 2013/0285289 A1* | 10/2013 | Feng et al. ..................... | 264/400 |
| 2013/0287998 A1* | 10/2013 | Feng et al. ..................... | 428/138 |
| 2014/0186256 A1* | 7/2014 | Wu et al. ...................... | 423/447.3 |
| 2014/0186546 A1* | 7/2014 | Wu et al. ...................... | 427/545 |
| 2014/0186547 A1* | 7/2014 | Wu et al. ...................... | 427/545 |

* cited by examiner

*Primary Examiner* — Jeffrie R Lund
(74) *Attorney, Agent, or Firm* — Novak Druce Connolly Bove + Quigg LLP

(57) ABSTRACT

A reactor includes a reactor chamber and a carbon nanotube catalyst composite layer. The reactor chamber has an inlet and an outlet. The carbon nanotube catalyst composite layer rotates in the reactor chamber, wherein the carbon nanotube catalyst composite layer defines a number of apertures, gases in the reactor chamber flow penetrate the carbon nanotube catalyst composite layer through the plurality of apertures.

15 Claims, 10 Drawing Sheets

REACTOR AND METHOD FOR GROWING CARBON NANOTUBE USING THE SAME

CROSS-REFERENCE TO RELATED APPLICATIONS

This application claims all benefits accruing under 35 U.S.C. §119 from China Patent Application 201210587684.0, filed on Dec. 29, 2012 in the China Intellectual Property Office, the disclosure of which is incorporated herein by reference.

BACKGROUND

1. Technical Field

The present disclosure relates to reactor and a method for growing carbon nanotubes using the same.

2. Description of the Related Art

Carbon nanotubes (CNT) are very small tube-shaped structures, and have extremely high electrical conductivity, very small diameter, and a tip-surface area near the theoretical limit. Due to these and other properties, it has been suggested that CNTs can play an important role in fields such as microscopic electronics, field emission devices, thermal interface materials, etc. Recently, a research is focus on how to use the CNT as substrate to grow new particles in the reactor.

However, because of the limitation of the CNT such as small diameter, it is difficult to utilize the CNT to grow particles as the substrate in the reactor.

What is needed, therefore, is providing a reactor that can overcome the above-described shortcomings.

BRIEF DESCRIPTION OF THE DRAWINGS

Many aspects of the embodiments can be better understood with reference to the following drawings. The components in the drawings are not necessarily drawn to scale, the emphasis instead being placed upon clearly illustrating the principles of the embodiments. Moreover, in the drawings, like reference numerals designate corresponding parts throughout the several views.

DETAILED DESCRIPTION

The disclosure is illustrated by way of example and not by way of limitation in the figures of the accompanying drawings in which like references indicate similar elements. It should be noted that references to "an" or "one" embodiment in this disclosure are not necessarily to the same embodiment, and such references mean at least one.

Figure 1:
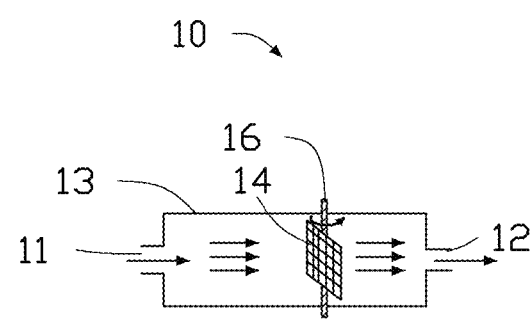
FIG. 1 is schematic view of one embodiment of a reactor.

Referring to FIG. 1, a reactor 10 of one embodiment includes a reactor chamber 13, a carbon nanotube catalyst composite layer 14 located in the reactor chamber 13, and the carbon nanotube catalyst composite layer 14 is rotatable.

The reactor chamber 13 accommodates the carbon nanotube catalyst composite layer 14 therein. The reactor chamber 13 has an inlet 11 and an outlet 12. The inlet 11 is configured for introducing a carbon-containing gas into the reactor chamber 13, thus producing (i.e., acting as a source of) carbon atoms for growing the carbon nanotube film (not shown). The outlet 12 is configured for allowing an exhaust gas to be discharged therefrom. Preferably, the inlet 11 and the outlet 12 are located at opposite sidewalls of the reactor chamber 13, and the carbon-containing gas can flow from the inlet 11 towards the outlet 12 along a direct path, and thus the exhaust gas can be discharged timely.

The reactor chamber 13 may have a circular, elliptic, triangular, rectangular, other regular polygonal or irregular polygonal profile in view of a cross section of the reactor chamber 13. The reactor chamber 13 may be made of a material with a high temperature resistance and chemically stable performance. For example, the reactor chamber 13 may be made of quartz, ceramic, stainless steel or the like. In the present embodiment, the reactor chamber 13 is a tube, and has a circular cross section. An inner radius of the reactor chamber 13 can range from about 1 centimeter to about 20 centimeters. In one embodiment, the inner radius of the reactor chamber 13 ranges from about 2.5 centimeters to about 10 centimeters. Thus the carbon nanotube catalyst composite layer 14 can be easily received into the reactor chamber 13, and firmly fixed in the reactor chamber 13. A length of the reactor chamber 13 can range from about 2 centimeters to about 50 centimeters. In one embodiment, the length of the reactor chamber 13 is about 20 centimeters, and the inner radius of the reactor chamber 13 is about 2.5 centimeters.

The carbon nanotube catalyst composite layer 14 is received in the reactor chamber 13 between the inlet 11 and the outlet 12. The carbon nanotube catalyst composite layer 14 can rotate around at least one axis. In one embodiment, the carbon nanotube catalyst composite layer 14 is rotatable around a rotating shaft 16. Two opposite ends of the rotating shaft 16 are fixed on an inner wall of the reactor chamber 13, and the rotating shaft 16 is adapted to rotate. The carbon nanotube catalyst composite layer 14 is fixed on the rotating shaft 16 and can rotate with the rotating shaft 16. An angle α is defined between the rotating shaft 16 and a flow direction of gases in the reactor chamber 13. In one embodiment, the angle α is equal to 90 degrees, thus the flow direction of the gases flows perpendicular to the rotating shaft 16.

A material of the rotating shaft 16 can be gold, silver, aluminum, or insulating material such as ceramic. The rotating shaft 16 has certain mechanic strength and can maintain the shape. In one embodiment, the material of rotating shaft 16 is ceramic. The rotating shaft 16 is in a shape of bar, and two opposite ends of the rotating shaft 16 is fixed on the inner wall of the reactor chamber 13. In one embodiment, the cross section of the reactor chamber 13 is axisymmetric, and the symmetry axis of the cross section and the rotating shaft 16 is coaxial. The rotating shaft 16 can be driven by a motor (not shown) to rotate.

The shape of the carbon nanotube catalyst composite layer 14 can be selected according to the cross section of the reactor chamber 13, such as circular, elliptic, triangular or rectangular. The surface of the carbon nanotube catalyst composite layer 14 can be planar, curved, or wrinkled. An area of the carbon nanotube catalyst composite layer 14 can range from about 0.5 square centimeters to about 100 square centimeters. In one embodiment, the carbon nanotube catalyst composite layer 14 is rectangular shaped. The surface of the carbon nanotube catalyst composited layer 14 is planar.

Furthermore, the carbon nanotube catalyst composite layer 14 can be fixed in a frame 141, and the shape of the carbon nanotube catalyst composite layer 14 is maintained by the frame 141. The frame 141 is driven by the rotating shaft 16. The carbon nanotube catalyst composite layer 14 and the frame 141 are rotatable with the rotating shaft 16. In one embodiment, edges of the carbon nanotube catalyst composite layer 14 is attached to the frame 141. A mid section of the carbon nanotube catalyst composite layer 14 is suspended between the frame 141. The frame 141 can also be a grid to provide more structural support the carbon nanotube catalyst composite layer 14. The material of the frame 141 can be metal such as gold, aluminum, or copper. The material of the frame 141 can also be semiconductor, or nonmetal such as ceramic. In one embodiment, the material of the frame 141 is ceramic. While the carbon nanotube catalyst composite layer 14 is a freestanding structure and can maintain the shape of it, the frame 141 can be omitted.

The carbon nanotube catalyst composite layer 14 defines a plurality of apertures 142. The plurality of apertures 142 forms a plurality of channels between the inlet 11 and the outlet 12. The gases in the reactor chamber 13 can flow penetrate through the plurality of apertures 142. While the surface of the carbon nanotube catalyst composite layer 14 is planar, the gases in the reactor chamber 13 flows substantially perpendicular to the surface of the carbon nanotube catalyst composite layer 14. While the surface of the carbon nanotube catalyst composite layer 14 is curved or wrinkled, the gases in the reactor chamber 13 flows penetrate through the plurality of apertures 142 of the carbon nanotube catalyst composite layer 14. Furthermore, larger carbon nanotube catalyst composite layer 14 can be located into the reactor chamber 13.

Figure 8:
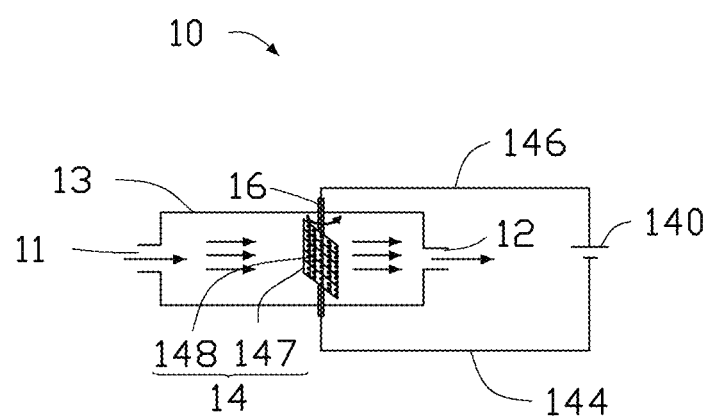
FIG. 8 is a schematic view of one embodiment of growing carbon nanotube using the reactor of FIG. 1.

Referring to FIG. 8, the carbon nanotube catalyst composite layer 14 includes a carbon nanotube layer 147 and a plurality of catalyst particles 148 uniformly dispersed on the carbon nanotube layer 147. The carbon nanotube layer 147 is a continuous single structure. The carbon nanotube layer 147 includes a plurality of carbon nanotubes oriented substantially parallel with the surface of the carbon nanotube layer 147. The carbon nanotubes in the carbon nanotube layer 147 can be single-walled, double-walled, or multi-walled carbon nanotubes. The length and diameter of the carbon nanotubes can be selected according to need. The thickness of the carbon nanotube layer 147 can be in a range from about 1 nm to about 100 μm, for example, about 10 nm, 100 nm, 200 nm, 1 μm, 10 μm or 50 μm.

Figure 2:
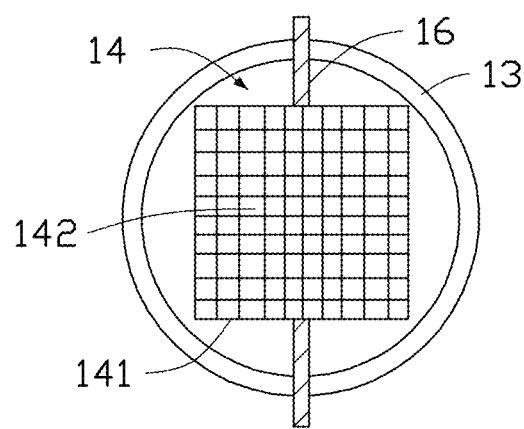
FIG. 2 shows a schematic view of a carbon nanotube catalyst composite layer in the reactor of FIG. 1.

Referring to FIG. 2, the carbon nanotube layer 147 forms a patterned structure. The patterned carbon nanotube layer 147 defines the plurality of apertures 142. The plurality of apertures 142 can be uniformly dispersed in the carbon nanotube layer 147. The plurality of apertures 142 extend throughout the carbon nanotube layer 147 along the thickness direction thereof. The aperture 142 can be a hole defined by several adjacent carbon nanotubes, or a gap defined by two substantially parallel carbon nanotubes and extending along axial direction of the carbon nanotubes. The size of the aperture 142 can be the diameter of the hole or width of the gap, and the average aperture size can be in a range from about 10 nm to about 500 μm, for example, about 50 nm, 100 nm, 500 nm, 1 μm, 10 μm, 80 μm or 120 μm. The hole-shaped apertures 142 and the gap-shaped apertures 142 can exist in the patterned carbon nanotube layer 147 at the same time. The sizes of the apertures 142 within the same carbon nanotube layer 147 can be different. In one embodiment, the sizes of the apertures 142 are in a range from about 10 nm to about 10 μm. A duty factor of the carbon nanotube layer 147 can be in a range from about 1:100 to about 100:1, for example, about 1:10, 1:2, 1:4, 4:1, 2:1 or 10:1. In one embodiment, the duty factor of the carbon nanotube layer 147 is in a range from about 1:4 to about 4:1.

The carbon nanotubes of the carbon nanotube layer 147 can be orderly arranged to form an ordered carbon nanotube structure or disorderly arranged to form a disordered carbon nanotube structure. The term 'disordered carbon nanotube structure' includes, but is not limited to, a structure where the carbon nanotubes are arranged along many different directions, and the aligning directions of the carbon nanotubes are random. The number of the carbon nanotubes arranged along each different direction can be substantially the same (e.g. uniformly disordered). The disordered carbon nanotube structure can be isotropic. The carbon nanotubes in the disordered carbon nanotube structure can be entangled with each other. The term 'ordered carbon nanotube structure' includes, but is not limited to, a structure where the carbon nanotubes are arranged in a consistently systematic manner, e.g., the carbon nanotubes are arranged approximately along a same direction and/or have two or more sections within each of which the carbon nanotubes are arranged approximately along a same direction (different sections can have different directions).

In one embodiment, the carbon nanotubes in the carbon nanotube layer 147 are arranged to extend along the direction substantially parallel to the carbon nanotube catalyst composite layer 14 to obtain greater gases transmission. After being placed in the reactor chamber 13, the carbon nanotubes in the carbon nanotube layer 147 are arranged to extend along the direction substantially perpendicular to the flow direction of the gases. In one embodiment, all the carbon nanotubes in the carbon nanotube layer 147 are arranged to extend along the same direction. In another embodiment, some of the carbon nanotubes in the carbon nanotube layer 147 are arranged to extend along a first direction, and some of the carbon nanotubes in the carbon nanotube layer 147 are arranged to extend along a second direction, perpendicular to the first direction.

The carbon nanotube layer 147 is a free-standing structure. The term "free-standing structure" means that the carbon nanotube layer 147 can sustain the weight of itself when it is hoisted by a portion thereof without any significant damage to its structural integrity. Thus, the carbon nanotube layer 147 can be suspended by the support 16. The free-standing carbon nanotube layer 147 can be laid on the support 16 directly and easily. Thus the carbon nanotube catalyst composite layer 14 is also a free-standing structure. The plurality of catalyst particles 148 is uniformly dispersed in the free-standing carbon nanotube layer 147.

The carbon nanotube layer 147 can be a substantially pure structure of the carbon nanotubes, with few impurities and chemical functional groups. The carbon nanotube layer 147 can be a composite including a carbon nanotube matrix and non-carbon nanotube materials. The non-carbon nanotube materials can be graphite, graphene, silicon carbide, boron nitride, silicon nitride, silicon dioxide, diamond, amorphous carbon, metal carbides, metal oxides, or metal nitrides. The non-carbon nanotube materials can be coated on the carbon nanotubes of the carbon nanotube layer 147 or filled in the apertures 142. In one embodiment, the non-carbon nanotube materials are coated on the carbon nanotubes of the carbon nanotube layer 147 so the carbon nanotubes can have a greater diameter and the apertures 142 can a have smaller size. The non-carbon nanotube materials can be deposited on the carbon nanotubes of the carbon nanotube layer 147 by CVD or physical vapor deposition (PVD), such as sputtering.

Furthermore, the carbon nanotube layer 147 can be treated with an organic solvent after being placed on the epitaxial growth surface 101 so the carbon nanotube layer 147 can be firmly attached on the epitaxial growth surface 101. Specifically, the organic solvent can be applied to the entire surface of the carbon nanotube layer 147 or the entire carbon nanotube layer 147 can be immersed in an organic solvent. The organic solvent can be volatile, such as ethanol, methanol, acetone, dichloroethane, chloroform, or mixtures thereof. In one embodiment, the organic solvent is ethanol.

The carbon nanotube layer 147 can include at least one carbon nanotube film, at least one carbon nanotube wire, or a combination thereof. In one embodiment, the carbon nanotube layer 147 can include a single carbon nanotube film or two or more stacked carbon nanotube films. Thus, the thickness of the carbon nanotube layer 147 can be controlled by the number of the stacked carbon nanotube films. The number of the stacked carbon nanotube films can be in a range from about 2 to about 100, for example, about 10, 30, or 50. In one embodiment, the carbon nanotube layer 147 can include a layer of parallel and spaced carbon nanotube wires. The carbon nanotube layer 147 can also include a plurality of carbon nanotube wires crossed or weaved together to form a carbon nanotube net. The distance between two adjacent parallel and spaced carbon nanotube wires can be in a range from about 0.1 μm to about 200 μm. In one embodiment, the distance between two adjacent parallel and spaced carbon nanotube wires can be in a range from about 10 μm to about 100 μm. The size of the apertures 142 can be controlled by controlling the distance between two adjacent parallel and spaced carbon nanotube wires. The length of the gap between two adjacent parallel carbon nanotube wires can be equal to the length of the carbon nanotube wire. It is understood that any carbon nanotube structure described can be used with all embodiments.

Figure 3:
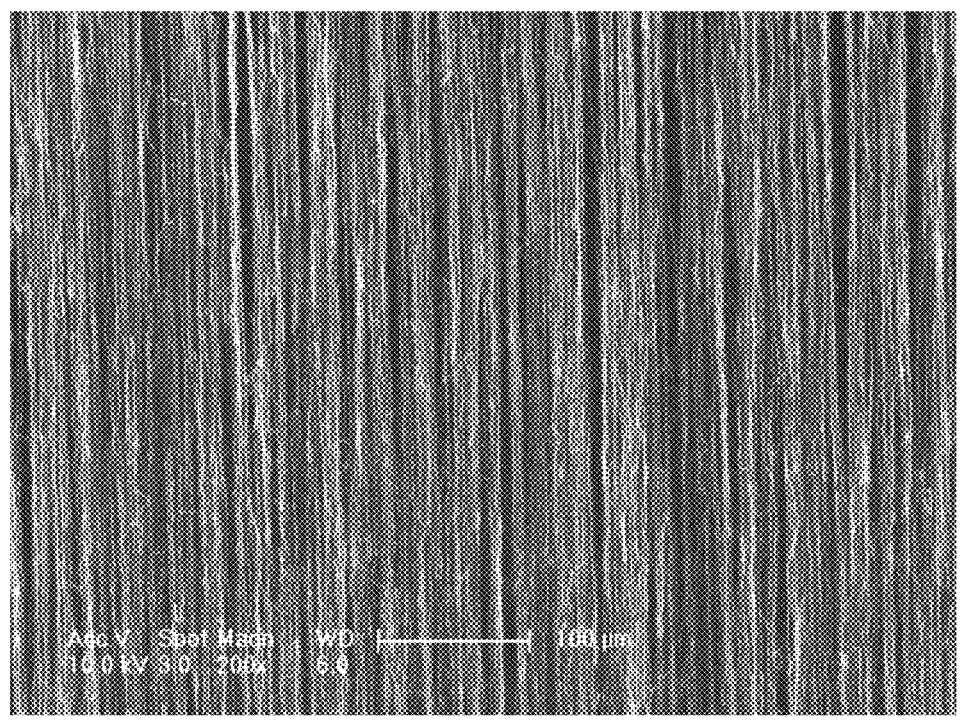
FIG. 3 shows a scanning electron microscope (SEM) image of one embodiment of a drawn carbon nanotube film.
Figure 4:
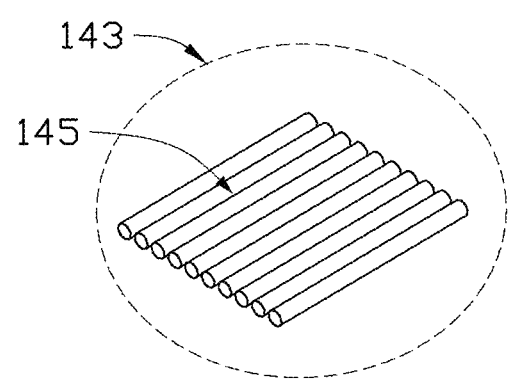
FIG. 4 shows a schematic view of one embodiment of a carbon nanotube segment of a drawn carbon nanotube film of FIG. 3.

In one embodiment, the carbon nanotube layer 147 includes at least one drawn carbon nanotube film. A drawn carbon nanotube film can be drawn from a carbon nanotube array that is able to have a film drawn therefrom. The drawn carbon nanotube film includes a plurality of successive and oriented carbon nanotubes joined end-to-end by van der Waals attractive force therebetween. The drawn carbon nanotube film is a free-standing film. Referring to FIGS. 3 and 4, each drawn carbon nanotube film includes a plurality of successively oriented carbon nanotube segments 143 joined end-to-end by van der Waals attractive force therebetween. Each carbon nanotube segment 143 includes a plurality of carbon nanotubes 145 parallel to each other, and combined by van der Waals attractive force therebetween. Some variations can occur in the drawn carbon nanotube film. The carbon nanotubes 145 in the drawn carbon nanotube film are oriented along a preferred orientation. The drawn carbon nanotube film can be treated with an organic solvent to increase the mechanical strength and toughness, and reduce the coefficient of friction of the drawn carbon nanotube film. A thickness of the drawn carbon nanotube film can range from about 0.5 nm to about 100 μm. The drawn carbon nanotube film can be fixed in the reactor chamber 13 directly.

Figure 5:
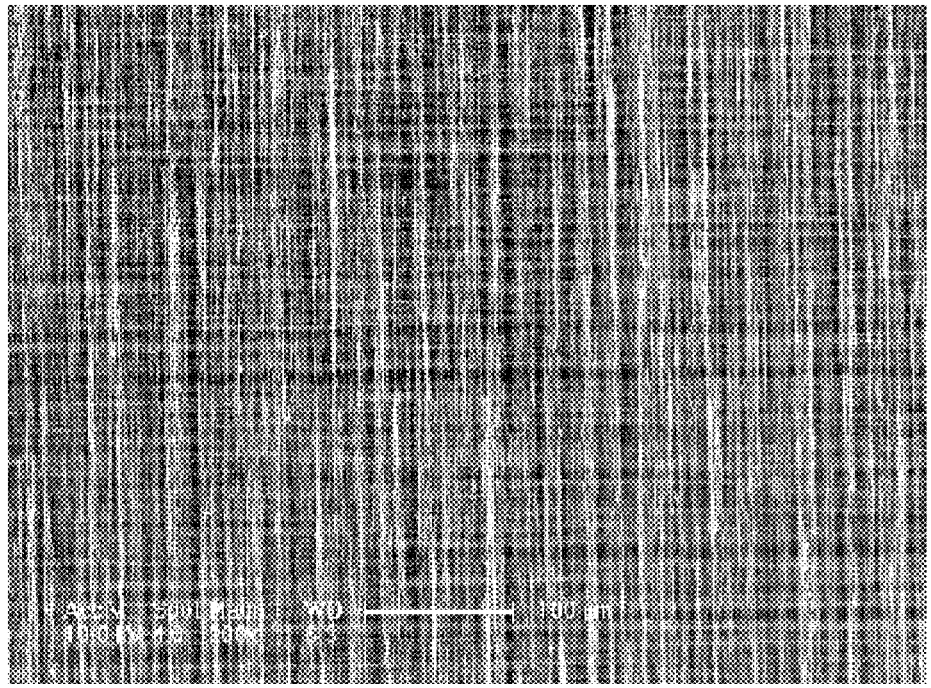
FIG. 5 shows a SEM image of one embodiment of a plurality of carbon nanotube films stacked in a cross order.

Referring to FIG. 5, the carbon nanotube layer 147 can include at least two stacked drawn carbon nanotube films. In other embodiments, the carbon nanotube layer 147 can include two or more coplanar carbon nanotube films, and each coplanar carbon nanotube film can include multiple layers. Additionally, if the carbon nanotubes in the carbon nanotube film are aligned along one preferred orientation (e.g., the drawn carbon nanotube film), an angle can exist between the orientation of carbon nanotubes in adjacent films, whether stacked or adjacent. Adjacent carbon nanotube films are combined by the van der Waals attractive force therebetween. An angle between the aligned directions of the carbon nanotubes in two adjacent carbon nanotube films can range from about 0 degrees to about 90 degrees. If the angle between the aligned directions of the carbon nanotubes in adjacent stacked drawn carbon nanotube films is larger than 0 degrees, a plurality of micropores is defined by the carbon nanotube layer 147. Referring to FIG. 5, the carbon nanotube layer 147 shown with the angle between the aligned directions of the carbon nanotubes in adjacent stacked drawn carbon nanotube films is 90 degrees. Stacking the carbon nanotube films will also add to the structural integrity of the carbon nanotube layer 147, and the aggregation of the catalyst particles 148 can be avoided. Thus the catalyst particles 148 can be uniformly dispersed in the carbon nanotube layer 147, and can be fully reacted with the gases.

In another embodiment, the carbon nanotube layer 147 can include a pressed carbon nanotube film. The pressed carbon nanotube film can be a free-standing carbon nanotube film. The carbon nanotubes in the pressed carbon nanotube film are arranged along a same direction or arranged along different directions. The carbon nanotubes in the pressed carbon nanotube film can rest upon each other. Adjacent carbon nanotubes are attracted to each other and combined by van der Waals attractive force. An angle between a primary alignment direction of the carbon nanotubes and a surface of the pressed carbon nanotube film is about 0 degrees to approximately 15 degrees. The greater the pressure is applied, the smaller the angle formed. If the carbon nanotubes in the pressed carbon nanotube film are arranged along different directions, the carbon nanotube layer 147 can be isotropic.

In another embodiment, the carbon nanotube layer 147 includes a flocculated carbon nanotube film. The flocculated carbon nanotube film can include a plurality of long, curved, disordered carbon nanotubes entangled with each other. Furthermore, the flocculated carbon nanotube film can be isotropic. The carbon nanotubes can be substantially uniformly dispersed in the carbon nanotube film. Adjacent carbon nanotubes are acted upon by van der Waals attractive force to form an entangled structure with micropores defined therein. The flocculated carbon nanotube film is very porous. Sizes of the micropores can be less than 10 μm. The porous nature of the flocculated carbon nanotube film will increase the specific surface area of the carbon nanotube layer 147. Additionally, because the carbon nanotubes in the carbon nanotube layer 147 are entangled with each other, the carbon nanotube layer 147 employing the flocculated carbon nanotube film has excellent durability, and can be fashioned into desired shapes with a low risk to the integrity of the carbon nanotube layer 147. In some embodiments, the flocculated carbon nanotube film is a free-standing structure because the carbon nanotubes being entangled and adhered together by van der Waals attractive force therebetween.

Figure 6:
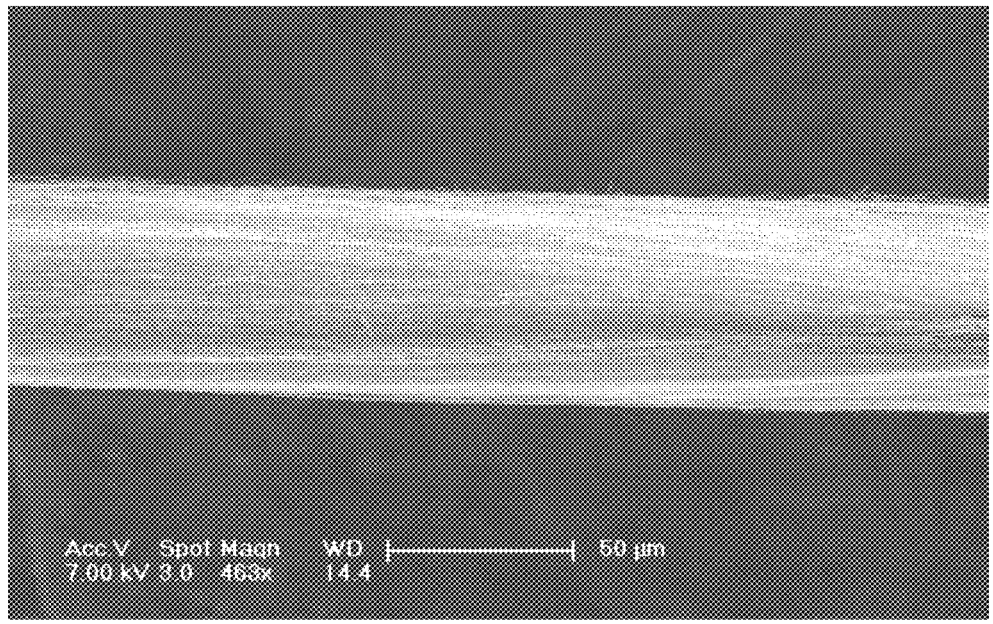
FIG. 6 shows a SEM image of one embodiment of an untwisted carbon nanotube wire.

The carbon nanotube wire can be untwisted or twisted. Treating the drawn carbon nanotube film with a volatile organic solvent can form the untwisted carbon nanotube wire. Specifically, the organic solvent is applied to soak the entire surface of the drawn carbon nanotube film. During the soaking, adjacent parallel carbon nanotubes in the drawn carbon nanotube film will bundle together, due to the surface tension of the organic solvent as it volatilizes. Thus, the drawn carbon nanotube film will be shrunk into untwisted carbon nanotube wire. Referring to FIG. 6, the untwisted carbon nanotube wire includes a plurality of carbon nanotubes substantially oriented along a same direction (i.e., a direction along the length of the untwisted carbon nanotube wire). The carbon nanotubes are parallel to the axis of the untwisted carbon nanotube wire. Specifically, the untwisted carbon nanotube wire includes a plurality of successive carbon nanotube segments joined end to end by van der Waals attractive force therebetween. Each carbon nanotube segment includes a plurality of carbon nanotubes substantially parallel to each other, and combined by van der Waals attractive force therebetween. The carbon nanotube segments can vary in width, thickness, uniformity, and shape. Length of the untwisted carbon nanotube wire can be arbitrarily set as desired. A diameter of the untwisted carbon nanotube wire ranges from about 0.5 nm to about 100 μm.

Figure 7:
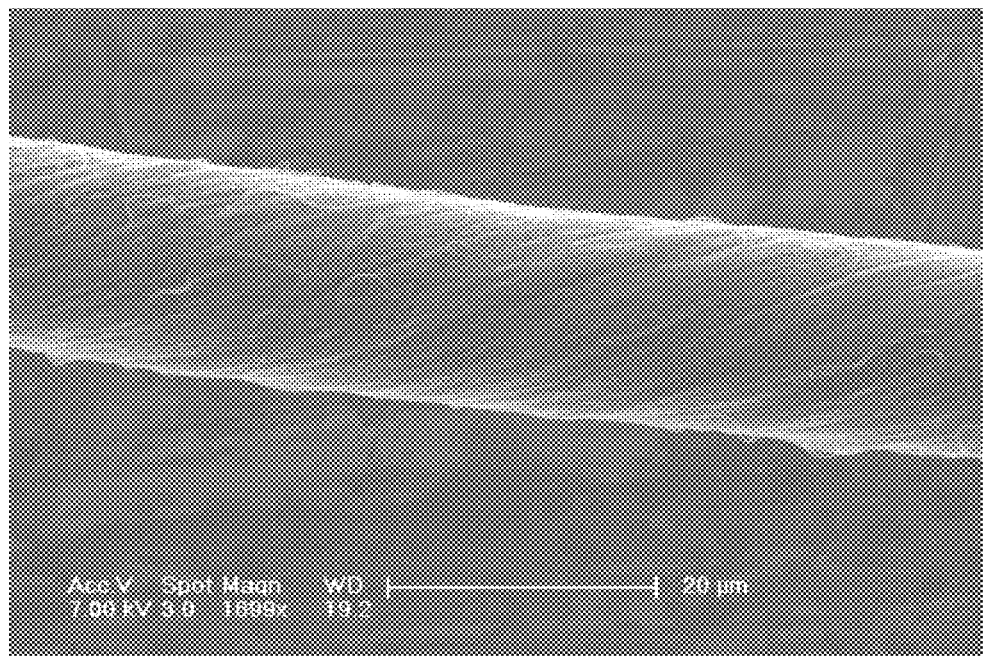
FIG. 7 shows a SEM image of one embodiment of a twisted carbon nanotube wire.

The twisted carbon nanotube wire can be formed by twisting a drawn carbon nanotube film using a mechanical force to turn the two ends of the drawn carbon nanotube film in opposite directions. Referring to FIG. 7, the twisted carbon nanotube wire includes a plurality of carbon nanotubes helically oriented around an axial direction of the twisted carbon nanotube wire. In one embodiment, the twisted carbon nanotube wire includes a plurality of successive carbon nanotube segments joined end to end by van der Waals attractive force therebetween. Each carbon nanotube segment includes a plurality of carbon nanotubes parallel to each other, and combined by van der Waals attractive force therebetween. Length of the carbon nanotube wire can be set as desired. A diameter of the twisted carbon nanotube wire can be from about 0.5 nm to about 100 μm. Further, the twisted carbon nanotube wire can be treated with a volatile organic solvent after being twisted. After being soaked by the organic solvent, the adjacent paralleled carbon nanotubes in the twisted carbon nanotube wire will bundle together, due to the surface tension of the organic solvent when the organic solvent volatilizes. The specific surface area of the twisted carbon nanotube wire will decrease, while the density and strength of the twisted carbon nanotube wire will be increased.

The plurality of catalyst particles 148 can be deposited on the carbon nanotube layer 147 via electron beam evaporation, thermal chemical vapor deposition, or sputtering method. The catalyst particles 148 can form a catalyst layer in a thickness ranging from about 2 nanometers to about 500 nanometers. A material of the catalyst particle 148 can be Fe, Co, Ni, or any alloy of them. A diameter of the catalyst particle 148 ranges from about 5 nanometers to about 10 nanometers. The plurality of catalyst particles 148 is uniformly dispersed in the carbon nanotube layer 147. The plurality of catalyst particles 148 can be uniformly attached and dispersed on the surface of the plurality of carbon nanotubes via van der Waals force. The plurality of catalyst particles 148 can also be fixed in the plurality of apertures 142, thus the aggregation of the plurality of catalyst particles 148 can be avoided. While the diameter of the catalyst particle 148 is greater than the size of the aperture 142, the catalyst particle 148 can be partly fixed in the aperture 142. While the diameter of the catalyst particle 148 is substantially equal to the size of the aperture 142, the catalyst particle 148 can be embedded into the aperture 142. In one embodiment, a material of the catalyst particle is about 8 nanometers, and the thickness of the catalyst layer is about 5 nanometers.

A method of growing carbon nanotube with the reactor 10 includes following steps:

(S11) providing the reactor 10;

(S12) introducing a mixture of a carbon source gas and a carrier gas into the reactor chamber 13;

(S13) rotating the carbon nanotube catalyst composite layer 14; and (S14) heating the carbon nanotube catalyst composite layer 14 to grow carbon nanotubes.

In step (S12), the mixture is introduced into the reactor chamber 13 through the inlet 11. An angle between the flow direction of the mixture and the surface of the carbon nanotube catalyst composite layer 14 is greater than 0 degrees and smaller or equal to 90 degrees. In one embodiment, the flow direction of the mixture is substantially perpendicularly with the surface of the carbon nanotube catalyst composite layer 14, and the mixture flow penetrate through the plurality of the apertures 142. Furthermore, the mixture flow out of the reactor chamber 13 through the outlet 12. A flow speed of the mixture introducing into the reactor chamber 13 is substantially equal to a flow speed of the mixture flow out of the chamber 13. Therefore, the carbon source gas in the reactor chamber can be updated to maintain density of the carbon source gas.

The plurality of catalyst particles 148 is firmly fixed in the carbon nanotube layer 147, thus the flow of the gases cannot affect the distribution of the plurality of catalyst particles 148. Thus the aggregation of the plurality of catalyst particles 148 can be effectively avoided. The growing speed of the carbon nanotubes depends on the ratio between the temperature of the plurality of catalyst particles 148 and the temperature of the reactor 10. Therefore, the growing speed of the carbon nanotubes can be controlled via controlling the flow speed and pressure of the mixture, ensuring that the flow speed and pressure of the mixture cannot break the carbon nanotube catalyst composite layer 14.

The carrier gas can be a noble gas, nitrogen, or hydrogen. The carrier gas can also be used to adjust the pressure of the furnace 19. The carbon source gas can be a hydrocarbon such as methane, acetylene, ethylene or ethane. The ratio of the carbon source gas and the protective gas can be about 1:1 to about 5:1. In one embodiment, the carrier gas is argon and can be introduced at a flow rate of 100 sccm. The carbon source gas is ethylene and can be introduced at a flow rate of 1000 sccm.

In step (S13), the rotation of the carbon nanotube catalyst composite layer 14 can be performed by driving the rotating shaft 16. During the rotation of the carbon nanotube catalyst composite layer 14, much more gases can be introduced into the reactor chamber 13 with the rotation. Thus the reaction speed between the catalyst particles 148 and the gases can be improved. Furthermore, the flow direction of the gases is substantially perpendicular to the carbon nanotube catalyst composite layer 14 during rotating the carbon nanotube catalyst composite layer 14, and the gases flows penetrate the plurality of apertures 142. Thus the carbon source gas can be fully reacted with the catalyst particles 148, and the quality of the carbon nanotubes grown in the reactor 10 will be improved.

In step (S14), the reactor chamber 13 can be heated to a reaction temperature to grow carbon nanotubes via a heating device (not shown). In one embodiment, the reactor chamber 13 can be heated by introducing an electric current into the carbon nanotube layer 147 via a first electrode 144 and a second electrode 146. The first electrode 144 and the second electrode 146 are spaced from each other and electrically connected to the carbon nanotube layer 147.

A voltage is applied between the first electrode 144 and the second electrode 146 via a power supply 140, and the electric current is introducing into the carbon nanotube layer 147. The carbon nanotube layer 147 can transfer electric energy to heat effectively. The voltage can be selected according to the length of the carbon nanotube layer 147 and the diameter of the carbon nanotubes. In one embodiment, the diameter of the carbon nanotubes is about 5 nanometers, and the voltage is about 40 V. During the process of heating the carbon nanotube layer 147, the temperature of the carbon nanotube layer 147 rapidly increases due to Joule-heating. The carbon nanotube layer 147 is heated to a temperature in a range from about 500° C. to about 900° C. Furthermore, the temperature of the reactor chamber 13 only ranges from about 30° C. to about 50° C. Thus a greater temperature difference is existed between the carbon nanotube layer 147 and the reactor chamber 13. Therefore, the growing speed of the carbon nanotubes on the carbon nanotube layer 147 can be improved. The reacting time ranges from about 30 minutes to about 60 minutes.

Furthermore, during the process of applying a voltage to the carbon nanotube layer 147, a heating device (not shown) can be used to heat the reactor chamber 13 to increase the growing speed of the carbon nanotubes.

The reactor 10 has following advantages. First, due to the chemical stability of the carbon nanotube layer 147, the carbon nanotubes in the carbon nanotube layer 147 cannot react with the catalyst particles 148. Second, the carbon nanotubes in the carbon nanotube layer 147 have great surface area, thus the carbon nanotubes have great attractive force, and the catalyst particles 148 can be directly and firmly fixed on the surface of carbon nanotubes, the additive can be avoided. Third, the carbon nanotube layer 147 defines the plurality of apertures 142, thus the catalyst particles 148 can be effectively embedded into the plurality of apertures 142, and aggregation and deactivation of the catalyst particles 148 during growing process can be avoided. Fourth, the carbon nanotube layer 147 can transfer electric energy to heat effectively, and the reactor chamber 13 can be heated by directly intruding an electric current into the carbon nanotube layer 147, thus the heating device can be avoided, low in cost. Fifth, due to the rotation of the carbon nanotube catalyst composite layer 14, much more gases can be suck into the reactor chamber 13, thus the flowing speed of the gases can be improved, and the growing speed of the carbon nanotubes can be improved.

Figure 9:
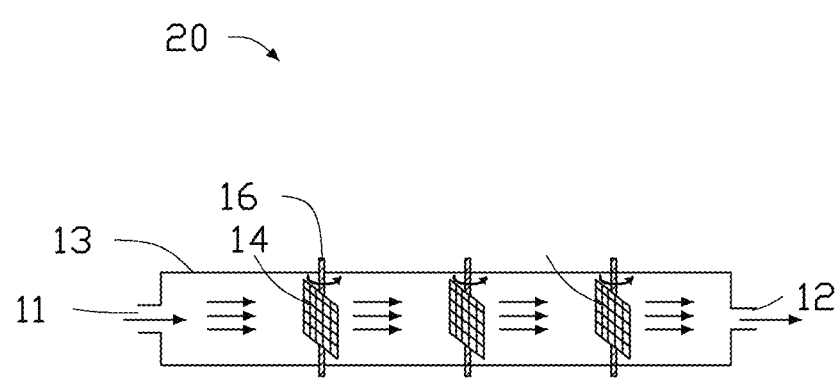
FIG. 9 shows a schematic view of another embodiment of a reactor.

Referring to FIG. 9, a reactor 20 of one embodiment includes a reactor chamber 13, and a plurality of carbon nanotube catalyst composite layers 14 spaced from each other and located in the reactor chamber 13. The reactor chamber 13 includes an inlet 11 and an outlet 12 on the two opposite ends of the reactor chamber 13. The plurality of carbon nanotube catalyst composite layers 14 is suspended in the chamber 13 and arranged along an direction from the inlet 11 to the outlet 12. Each of the plurality of carbon nanotube catalyst composite layers 14 can rotate around a rotating shaft 16 in the reactor chamber 13. The structure of reactor 20 is similar to the structure of reactor 10, except that the reactor 20 includes a plurality of carbon nanotube catalyst composite layers 14.

The plurality of rotating shafts 16 can parallel with each other. The distance between adjacent two carbon nanotube catalyst composite layers 14 can be same or different. In one embodiment, the plurality of carbon nanotube catalyst composite layers 14 is spaced with a certain distance. The distance can range from about 2 centimeters to about 50 centimeters. The distance can keep the plurality of carbon nanotube catalyst composite layers 14 from being contacted with each other.

Figure 10:
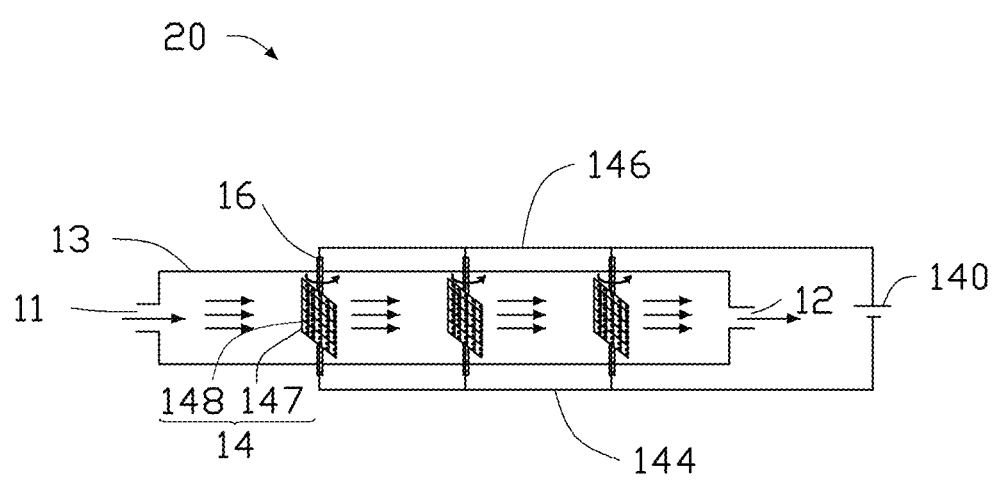
FIG. 10 is a schematic view of one embodiment of growing carbon nanotube using the reactor of FIG. 9.

Referring to FIG. 10, a method of growing carbon nanotubes with reactor 20 includes following steps:

(S21) providing a reactor 20;

(S22) introducing a mixture of a carbon source gas and a carrier gas into the reactor chamber 13, and the mixture successively penetrate the plurality of carbon nanotube catalyst composite layer 14;

(S23) rotating the plurality of carbon nanotube catalyst composite layer 14; and (S24) growing carbon nanotubes by heating the plurality of carbon nanotube catalyst composite layer 14.

In step (S23), the mixture is introduced into the reactor chamber 13 through the inlet 11, and flows through the plurality of carbon nanotube catalyst composite layers 14. Thus the carbon source gas can be successively reacted with the plurality of catalyst 148 of the plurality of carbon nanotube catalyst composite layers 14. Therefore the carbon source gas can be effectively decomposed, and the productivity can be improved.

In step (S24), the plurality of carbon nanotube catalyst composite layers 14 can be heated at the same time, or selectively heated. In one embodiment, the plurality of carbon nanotube catalyst composite layers 14 is electrically connected to a first electrode 144 and a second electrode 146. The plurality of carbon nanotube catalyst composite layers 14 is electrically connected with the first electrode 144 and the second electrode 146 in parallel. While applying a voltage between the first electrode 144 and the second electrode 146, the electric current can be introduced into the plurality of carbon nanotube catalyst composite layers 14 to heat them. Furthermore, a switch (not shown) can be applied between each of the plurality of carbon nanotube catalyst composite layers 14 and the first electrode 144 or the second electrode 146. Thus each of the plurality of carbon nanotube catalyst composite layers 14 can be independently controlled.

The reactor 20 has following advantages. First, the carbon nanotubes can be grown on the plurality of carbon nanotube catalyst composite layer 14 at the same time, thus the productivity can be improved. Second, carbon source gas can successively flow through the plurality of carbon nanotube catalyst composite layers 14, thus the carbon source gas can be effectively reacted with the carbon nanotube catalyst particles. Third, the plurality of carbon nanotube catalyst composite layer 14 can be independently controlled, and the electric can be selectively introduced into the plurality of carbon nanotube catalyst composite layer 14. Even one of the plurality of carbon nanotube catalyst composite layer 14 cannot work normally, other carbon nanotube catalyst composite layer 14 can still work, thus the lifespan of the reactor 20 can be prolonged.

Depending on the embodiment, certain of the steps of methods described may be removed, others may be added, and that order of steps may be altered. It is also to be understood that the description and the claims drawn to a method may include some indication in reference to certain steps. However, the indication used is only to be viewed for identification purposes and not as a suggestion as to an order for the steps.

It is to be understood that the above-described embodiments are intended to illustrate rather than limit the disclosure. Variations may be made to the embodiments without departing from the spirit of the disclosure as claimed. It is understood that any element of any one embodiment is considered to be disclosed to be incorporated with any other embodiment. The above-described embodiments illustrate the scope of the disclosure but do not restrict the scope of the disclosure.

What is claimed is:

1. A reactor comprising:
a reactor chamber comprising an inlet and an outlet;
at least one carbon nanotube catalyst composite layer positioned in the reactor chamber, wherein the at least one carbon nanotube catalyst composite layer defines a plurality of apertures, the at least one carbon nanotube catalyst composite layer being positioned to facilitate gases penetrate into the carbon nanotube catalyst composite layer through the plurality of apertures, and the carbon nanotube catalyst composite layer being rotatable.

2. The reactor of claim 1, wherein the carbon nanotube catalyst composite layer is a continuous and free-standing structure and comprises a carbon nanotube layer and a plurality of catalyst particles dispersed in the carbon nanotube layer.

3. The reactor of claim 2, wherein a surface of the carbon nanotube catalyst composite layer facing the inlet is planar.

4. The reactor of claim 2, wherein the carbon nanotube layer provides the free-standing structure of the carbon nanotube catalyst composite layer, and the plurality of catalyst particles is directly attached to a surface of the carbon nanotube layer.

5. The reactor of claim 2, wherein the plurality of apertures extends through a thickness of the carbon nanotube catalyst composite layer.

6. The reactor of claim 5, wherein a size of the plurality of apertures ranges from about 5 nanometers to about 10 nanometers.

7. The reactor of claim 6, wherein the plurality of catalyst particles is embedded into the plurality of apertures.

8. The reactor of claim 1, wherein the carbon nanotube catalyst composite layer comprises at least one carbon nanotube film, and the at least one carbon nanotube film comprises a plurality of carbon nanotubes oriented substantially along an alignment direction, the alignment direction being substantially parallel to the carbon nanotube catalyst composite layer.

9. The reactor of claim 8, wherein the carbon nanotube catalyst composite layer comprises at least two carbon nanotube films stacked on each other, an angle between the alignment directions of adjacent of the at least two carbon nanotube films ranges from about 0 degrees to about 90 degrees.

10. The reactor of claim 1, the reactor chamber comprises a rotating shaft, wherein the carbon nanotube catalyst composite layer is rotatable around the rotating shaft.

11. The reactor of claim 10, wherein the carbon nanotube catalyst composite layer is fixed on the rotating shaft and rotatable with the rotating shaft.

12. The reactor of claim 1, further comprising a frame rotatably mounted in the reactor chamber, and the carbon nanotube catalyst composite layer is fixed and suspended on the frame.

13. The reactor of claim 1, further comprising a plurality of carbon nanotube catalyst composite layers aligned along a flow direction of the gases in the reactor chamber.

14. The reactor of claim 13, wherein the plurality of carbon nanotube catalyst composite layers are spaced from each other.

15. The reactor of claim 1, further comprising a first electrode and a second electrode electrically connected to the carbon nanotube catalyst composite layer, wherein the first electrode and the second electrode are spaced from each other.

* * * * *